(12) United States Patent
Lee et al.

(10) Patent No.: US 7,829,205 B2
(45) Date of Patent: Nov. 9, 2010

(54) ORGANIC LIGHT EMITTING DEVICE

(75) Inventors: Tae-Woo Lee, Seoul (KR); Tae-Yong Noh, Gunpo-si (KR); Yu-Jin Kim, Suwon-si (KR); Lyong-Sun Pu, Suwon-si (KR); Sang-Hoon Park, Seongnam-si (KR); In-Nam Kang, Ansan-si (KR); Sang-Yeol Kim, Gwacheon-si (KR); Mu-Gyeom Kim, Hwaseong-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 700 days.

(21) Appl. No.: 11/320,810

(22) Filed: Dec. 30, 2005

(65) Prior Publication Data

US 2006/0147752 A1 Jul. 6, 2006

(30) Foreign Application Priority Data

Dec. 31, 2004 (KR) .................. 10-2004-0117961

(51) Int. Cl.
*H01L 51/54* (2006.01)
(52) U.S. Cl. ............ 428/690; 428/917; 313/504; 313/506; 252/301.16; 257/40; 257/E51.018
(58) Field of Classification Search .......... 428/690, 428/917; 313/504, 506; 257/40, E51.044
See application file for complete search history.

(56) References Cited

U.S. PATENT DOCUMENTS

| | | | |
|---|---|---|---|
| 5,281,489 A | 1/1994 | Mori et al. | |
| 5,783,292 A * | 7/1998 | Tokito et al. | 428/212 |
| 6,043,510 A * | 3/2000 | Kawamoto | 257/40 |
| 6,049,167 A * | 4/2000 | Onitsuka et al. | 313/512 |
| 6,416,888 B1 * | 7/2002 | Kawamura et al. | 428/690 |
| 6,603,150 B2 | 8/2003 | Liao et al. | |
| 6,670,053 B2 | 12/2003 | Conley | |
| 7,297,417 B2 * | 11/2007 | Kim et al. | 428/690 |
| 2002/0050786 A1 * | 5/2002 | Yamazaki et al. | 313/504 |
| 2004/0021413 A1 * | 2/2004 | Ito et al. | 313/504 |
| 2005/0062406 A1 * | 3/2005 | Kinoshita | 313/504 |
| 2007/0116983 A1 * | 5/2007 | Kanno et al. | 428/690 |

FOREIGN PATENT DOCUMENTS

| | | |
|---|---|---|
| CN | 1838846 A | 9/2006 |
| CN | 649993 | 7/2010 |
| JP | 8-288069 A | 11/1996 |
| JP | 10-233283 A | 9/1998 |
| JP | 2001-203081 A | 7/2001 |
| JP | 2002-151269 A | 5/2002 |
| JP | 2002-324676 A | 11/2002 |
| JP | 2002-367784 A | 12/2002 |
| JP | 2004-047197 A | 2/2004 |
| JP | 2004-063139 A | 2/2004 |
| JP | 2004-071432 A | 3/2004 |
| JP | 2004-091262 A | 3/2004 |
| JP | 2004-262761 A | 9/2004 |

OTHER PUBLICATIONS

Corning "Magnesium fluoride MgF2 physical and chemical properties" 2003.*
Cheng et al. "Color center conversion by femtosecond pulse laser irradiation in LiF:F2 crystals." Optics Express, 2007. vol. 15, No. 14, pp. 8938-8942.*
Wang et al. "The dielectric constant of materials effect the property of the OLED." Microelectronics Journal, 2007. vol. 38, pp. 259-261.*
Zeijlmans van Emmichoven et al. "Electron promotion in collisions of protons with a LiF surface." Physical Review B, 1999. vol. 59, No. 16, pp. 10950-10958.*
*Office action* from the Chinese Patent Office issued in Applicant's corresponding Chinese Patent Application No. 2005-101375195 dated Aug. 29, 2008.

* cited by examiner

*Primary Examiner*—Callie E Shosho
*Assistant Examiner*—Michael Wilson
(74) *Attorney, Agent, or Firm*—Robert E. Bushnell, Esq.

(57) ABSTRACT

An organic light emitting device includes a first electrode, a hole injection layer, an inorganic layer, a hole transport layer, an emitting layer which are sequentially formed on the first electrode; and a second electrode. The organic light emitting device has a high emission efficiency and an extended lifetime.

15 Claims, 3 Drawing Sheets

ORGANIC LIGHT EMITTING DEVICE

CLAIM OF PRIORITY AND CROSS-REFERENCE TO RELATED PATENT APPLICATION

This application claims priority from Korean Patent Application No. 10-2004-0117961, filed on Dec. 31, 2004, in the Korean Intellectual Property Office, the disclosure of which is incorporated herein in its entirety by reference.

BACKGROUND

1. Field of the Invention

The present invention relates to an organic light emitting device, and more particularly, to an organic light emitting device including an inorganic layer and a hole transport layer, which is free from exciton quenching by preventing diffusion of impurities derived from a hole injection layer into an emitting layer, and has a high emission efficiency and an extended lifetime by improvements in electron blocking and backward diffusion phenomenon and hole transport capability into the emitting layer.

2. Description of the Related Art

Organic light emitting devices are self-emissive displays that emit light by recombination of electrons and holes in a fluorescent or phosphorescent organic layer when an electrical current is applied to the organic layer. The organic light emitting devices have advantages such as lightweight, simple constitutional elements, easy fabrication process, superior image quality, and wide viewing angle. In addition, the organic light emitting devices perfectly create moving pictures, produce high color purity, and have electrical properties suitable for portable electronic equipment such as low power consumption and low driving voltage.

In the organic light emitting devices, a multi-layer structure composed of a hole injection layer, an emitting layer, an electron injection layer, etc. is generally used as an organic layer, instead of a single emitting layer, in view of enhancement in emission efficiency and decrease in driving voltage.

As an example of an organic light emitting device with such a multi-layer structure, U.S. Pat. No. 6,670,053, by Conley et al., discloses an organic light emitting device including a layer made of a 3-phenylindolyl group-containing organic compound between a hole transport layer and an emitting layer. Meanwhile, U.S. Pat. No. 6,603,150, by Liao et al., discloses an organic light emitting device including an interface layer made of an organic material between a hole transport layer and an emitting layer to provide more balanced carrier recombination.

However, common organic light emitting devices provide unsatisfactory emission efficiency and lifetime. Therefore, there is a strong need for the improvement of organic light emitting devices.

SUMMARY OF THE INVENTION

The present invention provides an organic light emitting device including an inorganic layer and a hole transport layer made of an organic material, which is free from exciton quenching by preventing diffusion of impurities derived from a hole injection layer into an emitting layer, and has a high emission efficiency and an extended lifetime by improvements in electron blocking and backward diffusion phenomenon and hole transport capability into the emitting layer.

According to an aspect of the present invention, there is provided an organic light emitting device including a first electrode; a hole injection layer formed on the first electrode, an inorganic layer formed on the hole injection layer, a hole transport layer formed on the inorganic layer, an emitting layer formed on the hole transport layer, and a second electrode formed on the emitting layer.

It is preferred that an energy bandgap of a material constituting the inorganic layer is 0.1 to 15 eV higher than an energy bandgap of a material constituting the hole transport layer.

It is preferred that the inorganic layer is made of a material having a dielectric constant of 1.0 to 80.

It is preferred that the inorganic layer is made of a material having a work function of 3 to 6 eV.

It is preferred that the inorganic layer is made of one or more selected from the group consisting of metal halides, metal oxides, metal nitrides, metal salts, and metals.

It is preferred that the inorganic layer has a thickness of 0.1 to 10 nm.

It is preferred that an energy bandgap of a material constituting the hole transport layer is equal to or 3 eV higher than an energy bandgap of a material constituting the emitting layer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
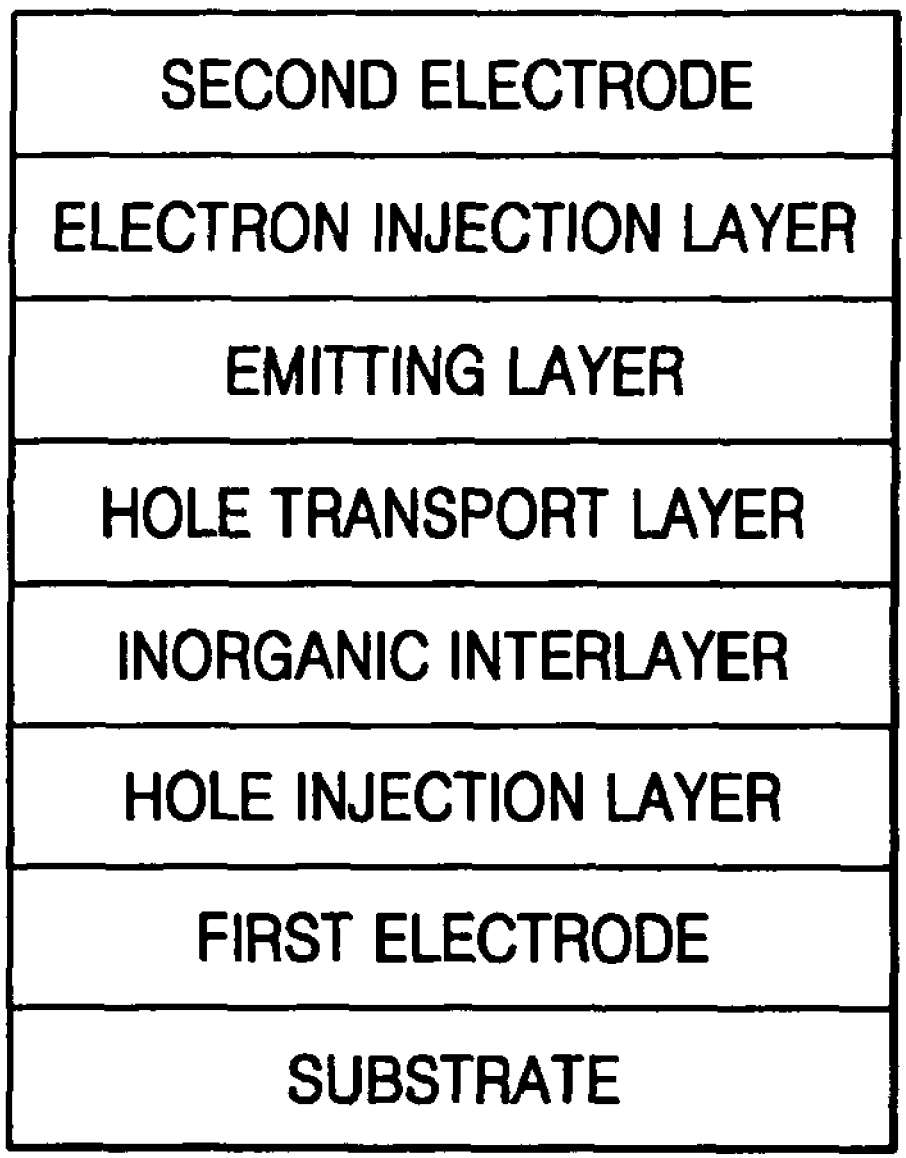
FIG. 1 is a schematic view illustrating an organic light emitting device according to an embodiment of the present invention.

Hereinafter, the present invention will be described in more detail with reference to the accompanying drawings.

An organic light emitting device according to an embodiment of the present invention includes an inorganic layer made of an inorganic material between a hole injection layer and a hole transport layer. The inorganic layer can prevent diffusion of impurities derived from the hole injection layer into an emitting layer and thus exciton quenching that may occur in the hole injection layer.

Preferably, the energy bandgap of a material constituting the inorganic layer is larger than that of a material constituting the hole transport layer. In more detail, the energy bandgap of the material constituting the inorganic layer may be 0.1 to 15 eV, preferably 0.5 to 5 eV higher than that of the material constituting the hole transport layer. When the energy bandgap of the material constituting the inorganic layer according to the present invention satisfies the above range, electron accumulation at an interface between the emitting layer and the hole transport layer and electron backward diffusion into the emitting layer are facilitated, thereby enhancing emission efficiency.

When the inorganic layer is made of a dielectric material, a dielectric material with a dielectric constant of 1.0 to 80, preferably 1.2 to 15 may be used. A dielectric material with a dielectric constant of less than 1.0 is a gaseous material, and thus, cannot be used in the present invention. On the other hand, a dielectric material with a dielectric constant above 80 is a liquid material with a large dipole momentum like water, and thus, cannot be used in the present invention.

When the inorganic layer is made of a metal with good conductivity, a metal material with a work function of 3 to 6 eV, preferably 4.5 to 5.5 eV may be used. If the work function of the metal material constituting the inorganic layer is less than 3.0 eV, an unstable layer structure may be formed and hole injection capability may be lowered due to excessively high reactivity of the metal material. On the other hand, the work function of the metal material constituting the inorganic layer cannot exceed 6.0 eV because there are no metal materials with a work function above 6.0 eV.

Considering the above-described energy bandgap, dielectric constant, and work function, an inorganic layer of an organic light emitting device of the present invention may be made of one or more selected from the group consisting of metal halides, metal oxides, metal nitrides, metal salts, and metals. In more detail, the inorganic layer may be made of metal halide such as LiF, NaF, $MgF_2$, $AlF_3$, $CaF_2$, $BaF_2$, $CsF_2$, and NaCl; metal oxide such as MgO, $Al_2O_3$, SiO, $SiO_2$, $Sc_2O_3$, ZnO, and $TiO_2$; metal nitride such as SiNx where $x \geq 1$; a metal salt such as LiI, $LiClO_4$, NaI, NaBr, and KI; or a metal such as Au, Pt, Al, Ag, Au, and Cr, but is not limited thereto. When needed, a combination of two or more selected from the above-described materials may be used.

In particular, $Al_2O_3$, LiF, and $BaF_2$ are preferable as a material constituting an inorganic layer according to the present invention, and have a dielectric constant of 10, 9.1, and 7.33, respectively, at 1 MHz. Meanwhile, among materials constituting an inorganic layer according to the present invention, LiF, $BaF_2$, MgO, $Al_2O_3$, and $TiO_2$ have an energy bandgap of 14 eV, 9.1 eV, 7.9 eV, 6-9 eV, and 3-6 eV, respectively.

The inorganic layer may have a thickness of 0.1 to 10 nm, preferably 0.2 to 5 nm, more preferably 0.5 to 1 nm. If the thickness of the inorganic layer is less than 0.1 nm, diffusion of impurities derived from a hole injection layer and exciton quenching may be insufficiently prevented. On the other hand, if it exceeds 10 nm, a driving voltage may increase, and emission efficiency may decrease.

An organic light emitting device according to an embodiment of the present invention includes a hole transport layer between an inorganic layer and an emitting layer. The hole transport layer is made of an organic material, and serves to facilitate hole transport into the emitting layer, and at the same time, serves as an electron blocking layer.

The energy bandgap of a material constituting the hole transport layer is equal to or up to 3 eV, preferably up to 1.0 eV higher than that of a material constituting the emitting layer, in view of hole transport capability and electron blocking capability for the emitting layer.

A material constituting the hole transport layer is not particularly limited but may be one or more selected from the group consisting of hole transporting carbazole- and/or arylamine-group containing compounds, phthalocyanine-based compounds, and triphenylene derivatives. In more detail, the hole transport layer may be made of one or more selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N,N'-diphenylbenzidine (α-NPD), N,N'-diphenyl-N,N'-bis(1-naphthyl)-(1,1'-biphenyl)-4,4'-diamine (NPB), IDE320 (Idemitsu, Japan), poly(9,9-dioctylfluorene-co-N-(4-butylphenyl)diphenylamine (TFB), and poly(9,9-dioctylfluorene-co-bis-N,N'-(4-butylphenyl)-bis-N,N'-phenyl-1,4-phenylenedi amine (PFB), but is not limited thereto.

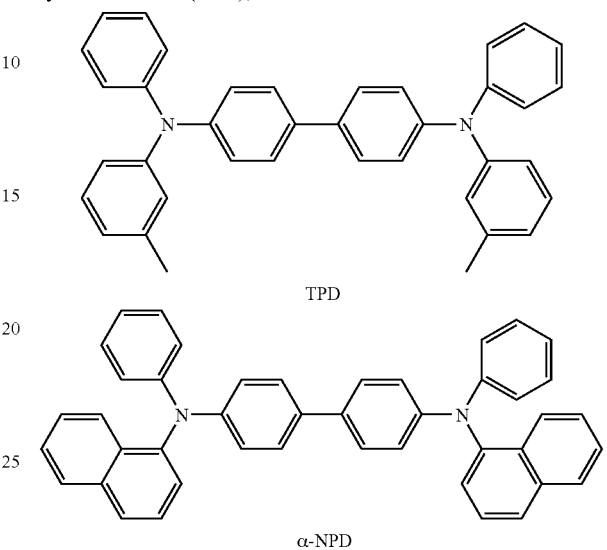

The hole transport layer may have a thickness of 1 to 100 nm, preferably 5 to 50 nm. It is particularly preferable that the hole transport layer has a thickness of 30 nm or less. If the thickness of the hole transport layer is less than 1 nm, an excessively thin hole transport layer may be formed, and thus, hole transport capability may be lowered. On the other hand, if it exceeds 100 nm, a driving voltage may increase.

An organic light emitting device according to the present invention includes a hole injection layer. A material constituting the hole injection layer is not particularly limited but may be copper phthalocyanine (CuPc); Starburst amines such as TCTA, m-MTDATA, and HI406 (Idemitsu); or soluble conductive polymers such as Pani/DBSA (polyaniline/dodecylbenzenesulfonic acid), PEDOT/PSS (poly(3,4-ethylenedioxythiophene)/poly(4-styrenesulfonate), Pani/CSA (polyaniline/camphor sulfonic acid), and PANI/PSS (polyaniline)/poly(4-styrenesulfonate).

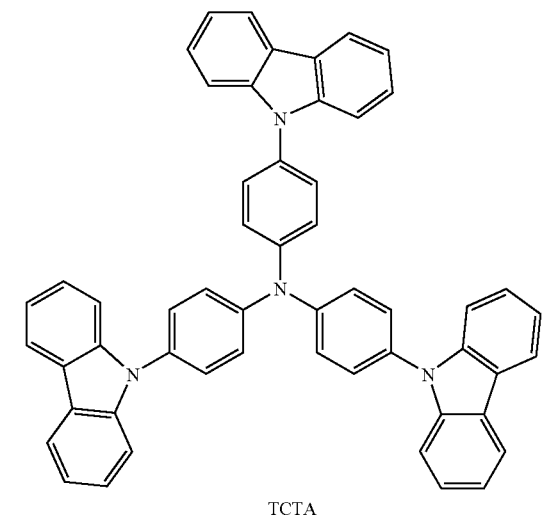

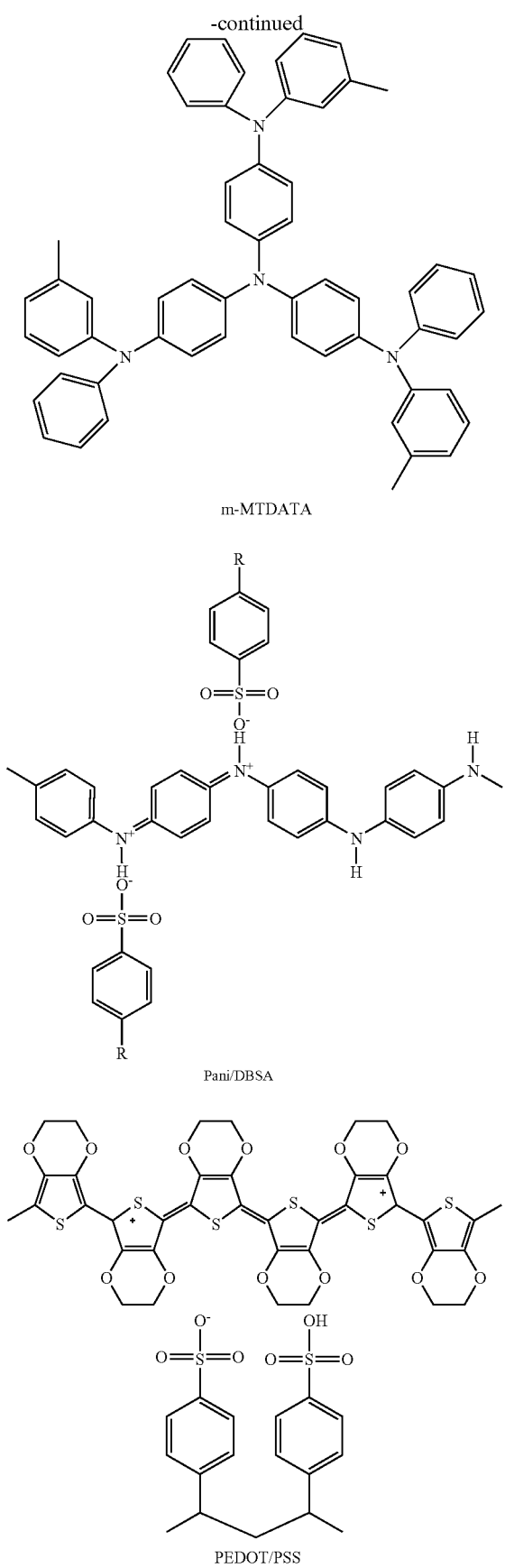

In particular, PEDOT/PSS is a very stable material that does not undergo a change in conductivity even when left stand at 100° C. in air for 1,000 hours. However, when the hole injection layer is made of Pani/DBSA or PEDOT/PSS, diffusion of impurities such as sulfonic acid, sulfate, and an alkaline metal ion derived from the hole injection layer into an organic layer adjacent to the hole injection layer, for example an emitting layer may occur, thereby lowering emission efficiency and lifetime of an organic light emitting device. However, an organic light emitting device according to the present invention includes an inorganic layer between a hole injection layer and a hole transport layer as described above, and thus, diffusion of impurities derived from the hole injection layer into an emitting layer is prevented, thereby providing high emission efficiency and long lifetime.

The hole injection layer may have a thickness of 5 to 100 nm, preferably 10 to 70 nm. A hole injection layer with a thickness of 50 nm is preferable. If the thickness of the hole injection layer is less than 5 nm, an excessively thin hole injection layer may be formed, and thus, hole injection capability may be insufficient. On the other hand, if it exceeds 100 nm, light transmittance may be lowered.

A method of manufacturing an organic light emitting device according to an embodiment of the present invention will now be described with reference to FIG. 1.

First, a first electrode is formed on an upper surface of a substrate. Here, the substrate may be a substrate commonly used for organic light emitting devices. A glass substrate or a transparent plastic substrate may be used as the substrate in view of transparency, surface smoothness, handling property, water resistance, etc. The first electrode may be a transparent electrode made of a material with good conductivity, such as indium tin oxide (ITO), indium zinc oxide (IZO), tin dioxide ($SnO_2$), zinc oxide (ZnO), or $In_2O_3$. Alternatively, the first electrode may be a reflective electrode composed of a reflective layer made of Ag, Al, Mg, Pt, Pd, Au, Ni, Nd, Ir, Cr, or a compound thereof, and a transparent electrode layer made of ITO, IZO, ZnO, or $In_2O_3$ formed on the reflective layer. In addition, various modifications of the above-illustrated first electrodes are possible.

A hole injection layer, an inorganic layer, and a hole transport layer are sequentially formed on an upper surface of the first electrode by vacuum thermal deposition or spin coating. A material constituting each layer and a thickness of each layer have been described above, and thus, a detailed description thereof will be omitted. Meanwhile, when the hole injection layer is made of PEDOT/PSS, it may be formed by spin coating using a solution obtained by dissolving PEDOT/PSS in water or an alcohol solvent. The hole transport layer may be formed by spin coating using a solution obtained by dissolving a hole transport material in an organic solvent. Here, the organic solvent may be dimethylsulfoxide (DMSO), N,N-dimethylformamide (DMF), tetrahydrofuran (THF), etc., and can be easily selected by those of ordinary skill in the art.

An emitting layer is formed on the hole transport layer. A material constituting the emitting layer is not particularly limited. Examples of the material constituting the emitting layer include, but are not limited to, blue-emitting materials such as oxadiazole dimer dyes (Bis-DAPOXP)), spiro compounds (2,2',7,7'-tetrakis(2,2-diphenylvinyl)spiro-9,9'-bifluorene (Spiro-DPVBi), Spiro-6P), triarylamine compounds, bis(styryl)amines (4,4'-bis(2,2'diphenyl vinyl)-1,1'-biphenyl (DPVBi), distyrylarylene derivatives (DSA), bis[2-(4,6-difluorophenyl)pyridinato-N, $C^{2'}$]iridium picolinate (Flrpic), CzTT, Anthracene, tetraphenylbutadiene (TPB), pentaphenylcyclopentadiene (PPCP), DST, triphenylamine (TPA), OXD-4, BBOT, and AZM-Zn; green-emitting materials such as Coumarin 6, C545T, Quinacridone, and fac-tris(2-phenylpyridine) iridium (Ir(ppy)₃); red-emitting materials such as [4-(dicyano-methylene-2-methyl-6-(p-dimethyl aminostyryl)-4H-pyran (DCM1), [2-methyl-6-[2-(2,3,6,7-tetrahydro-1H,5H-benzo quinolizine-9-yl)-ethenyl]-4H-pyran4-ylidene]propane-dinitrile (DCM2), Eu(thenoyltrifluoroacetone)₃ (Eu(TTA)₃), butyl-6-(1,1,7,7,-tetramethyljulolidyl-9-enyl)-4H-pyran (DCJTB); and polymer light-emitting materials containing polymers such as phenylenes, phenylene-vinylenes, thiophenes, fluorenes, and spiro-fluorenes, and nitrogen-containing aromatic compounds.

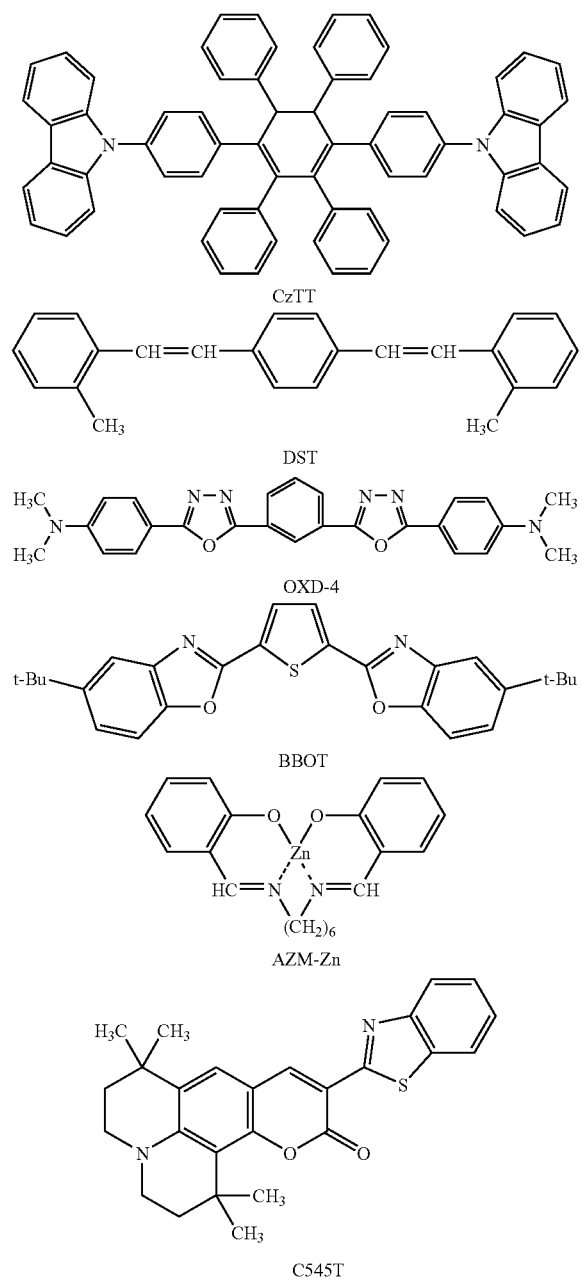

The thickness of the emitting layer may be in the range from 10 to 500 nm, preferably from 50 to 120 nm. It is particularly preferable that a blue-emitting layer has a thickness of 70 nm. If the thickness of the emitting layer is less than 10 nm, leakage current may increase, thereby lowering emission efficiency and lifetime. On the other hand, if it exceeds 500 nm, an increase in driving voltage may increase.

A hole blocking layer may be selectively formed on the emitting layer by vacuum deposition or spin coating of a hole blocking material. The hole blocking material is not particularly limited provided that it has electron transport capability and an ionization potential higher than a light-emitting material. Examples of the hole blocking material include bis(2-methyl-8-quinolato)-(p-phenylphenolato)-aluminum (Balq), bathocuproine(BCP), and tris(N-arylbenzimidazole)(TPBI).

The hole blocking layer may have a thickness of 1 to 100 nm, preferably 5 to 50 nm. If the thickness of the hole blocking layer is less than 1 nm, hole blocking capability may be insufficient. On the other hand, if it exceeds 100 nm, a driving voltage may increase.

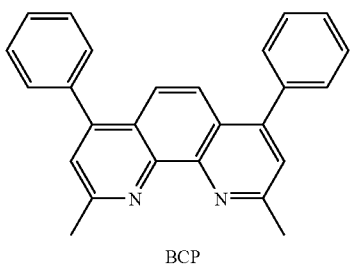

An electron transport layer is selectively formed on the emitting layer or the hole blocking layer by vacuum deposition or spin coating of an electron transport material. The electron transport material is not particularly limited but may be one or more of commonly known electron transport materials such as Alq₃, rubrene, a quinoline-based low molecular or polymer compound, and a quinoxaline-based low molecular or polymer compound. The electron transport layer may also be a multi-layer structure composed of two or more layers made of different materials.

The electron transport layer may have a thickness of 1 to 100 nm, preferably 10 to 50 nm. If the thickness of the electron transport layer is less than 1 nm, electron transport capability may be lowered. On the other hand, if it exceeds 100 nm, a driving voltage may increase.

An electron injection layer may be selectively formed on the emitting layer, the hole blocking layer, or the electron transport layer by vacuum deposition or spin coating. Examples of a material constituting the electron injection layer include, but are not limited to, BaF₂, LiF, NaF, MgF₂, AlF₃, CaF₂, NaCl, CsF, Li₂O, BaO, and Liq.

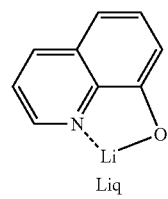

The electron injection layer may have a thickness of 0.1 to 30 nm, preferably 1 to 10 nm. It is particularly preferable that the electron injection layer has a thickness of 2 to 6 nm. If the thickness of the electron injection layer is less than 0.1 nm, electron injection capability may be insufficient. On the other hand, if it exceeds 30 nm, a driving voltage may increase or emission efficiency may decrease.

Finally, a second electrode is formed on the electron injection layer by deposition of a second electrode material to thereby complete an organic light emitting device.

The second electrode material may be lithium (Li), magnesium (Mg), aluminum (Al), aluminum-lithium (Al—Li), calcium (Ca), magnesium-indium (Mg—In), magnesium-silver (Mg—Ag), calcium-aluminum (Ca—Al), etc., but is not limited thereto. For example, when the second electrode is a bilayer structure composed of a calcium layer and an aluminum layer, the calcium layer may be formed to a thickness of 2 to 10 nm and the aluminum layer may be formed to a thickness of 100 to 300 nm.

The first electrode and the second electrode can serve as an anode and a cathode, respectively. Of course, the first electrode and the second electrode may serve as a cathode and an anode, respectively. An organic light emitting device according to the present invention can be provided in various types of organic light emitting displays. In particular, when an organic light emitting device according to the present invention is provided in an active matrix organic light emitting display, the first electrode may be electrically connected to a drain electrode of a thin film transistor.

While an organic light emitting device according to an embodiment of the present invention and a method of manufacturing the same have been particularly shown and described with reference to FIG. 1 illustrating an organic light emitting device having a sequentially stacked structure of a first electrode, a hole injection layer, an inorganic layer, a hole transport layer, an emitting layer, an electron injection layer, and a second electrode, it will be understood by those of ordinary skill in the art that various changes in form and details may be made therein without departing from the spirit and scope of the present invention as defined by the following claims.

Hereinafter, the present invention will be described more specifically by Examples. However, the following Examples are provided only for illustrations and thus the present invention is not limited to or by them.

EXAMPLES

Example 1

A 15Ω/cm$^2$ (1,200 Å) ITO glass substrate (manufactured by Corning Inc.) was cut into pieces of 50 mm×50 mm×0.7 mm in size, followed by ultrasonic cleaning in isopropyl alcohol and deionized water (5 minutes for each) and then UV/ozone cleaning (30 minutes), to be used as a first electrode.

A hole injection layer was formed to a thickness of 50 nm on the first electrode by spin coating of an aqueous solution of PEDOT/PSS (manufactured by Bayer) used as a hole injection material. Then, an inorganic layer was formed to a thickness of 1 nm on the hole injection layer by deposition of $Al_2O_3$ and a hole transport layer was formed to a thickness of 10 nm on the inorganic layer by spin coating of PFB (manufactured by Dow Chemical) used as a hole transport material.

An emitting layer was formed to a thickness of 70 nm on the hole transport layer using a spirofluorene-based polymer as a blue-emitting material and then an electron injection layer was formed to a thickness of 4 nm on the emitting layer by deposition of $BaF_2$. Finally, a second electrode was formed on the electron injection layer by sequential deposition of Ca (2.7 nm) and Al (250 nm), to complete an organic light emitting device as shown in FIG. 1, which was designated as "sample 1".

Example 2

A 15Ω/cm$^2$ (1,200 Å) ITO glass substrate (manufactured by Corning Inc.) was cut into pieces of 50 mm×50 mm×0.7 mm in size, followed by ultrasonic cleaning in deionized water and isopropyl alcohol (5 minutes for each) and then UV/ozone cleaning (30 minutes), to be used as a first electrode.

A hole injection layer was formed to a thickness of 50 nm on the first electrode by spin coating of an aqueous solution of PEDOT/PSS (manufactured by Bayer) used as a hole injection material. Then, an inorganic layer was formed to a thickness of 0.5 nm on the hole injection layer by deposition of $BaF_2$ and a hole transport layer was formed to a thickness of 10 nm on the inorganic layer by spin coating of PFB (manufactured by Dow Chemical) used as a hole transport material.

An emitting layer was formed to a thickness of 70 nm on the hole transport layer using a spirofluorene-based polymer different from that used in Example 1, as a blue-emitting material, and then an electron injection layer was formed to a thickness of 4 nm on the emitting layer by deposition of $BaF_2$. Finally, a second electrode was formed on the electron injection layer by sequential deposition of Ca (2.7 nm) and Al (250 nm), to complete an organic light emitting device as shown in FIG. 1, which was designated as "sample 2".

Comparative Examples 1A through 1C

Organic light emitting devices were manufactured in the same manner as in Example 1 except that an inorganic layer and a hole transport layer were as defined as Table 1 below. The organic light emitting devices manufactured in Comparative Examples 1A, 1B, and 1C were respectively designated as "samples 1A, 1B, and 1C".

TABLE 1

| Sample | Inorganic layer ($Al_2O_3$ layer) | Hole transport layer (PFB layer) |
| --- | --- | --- |
| Sample 1A | X | X |
| Sample 1B | X | ○ |
| Sample 1C | ○ | X |

X: absence of target layer;
○: presence of target layer

Comparative Examples 2A through 2C

Organic light emitting devices were manufactured in the same manner as in Example 2 except that an inorganic layer and a hole transport layer were as defined as Table 2 below. The organic light emitting devices manufactured in Comparative Examples 2A, 2B, and 2C were respectively designated as "samples 2A, 2B, and 2C".

TABLE 2

| Sample | Inorganic layer ($BaF_2$ layer) | Hole transport layer (PFB layer) |
| --- | --- | --- |
| Sample 2A | X | X |
| Sample 2B | X | ○ |
| Sample 2C | ○ | X |

X: absence of target layer;
○: presence of target layer

Evaluation Example 1

Emission Efficiency Characteristics

Figure 2:
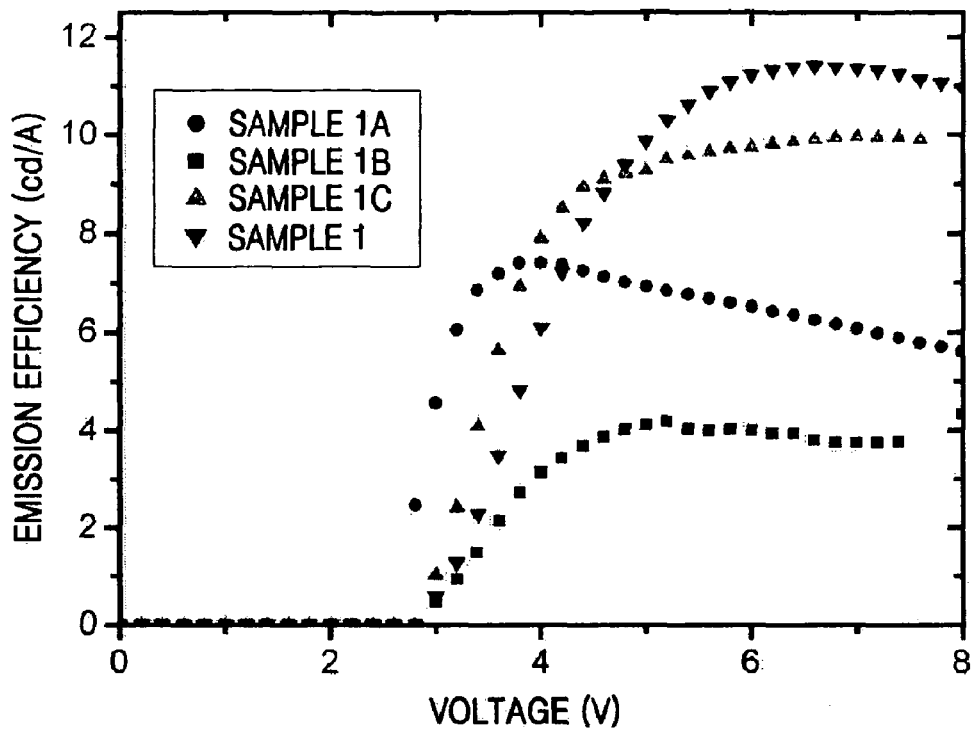
FIGS. 2 and 3 are graphs illustrating the efficiencies of organic light emitting devices according to embodiments of the present invention.
Figure 3:
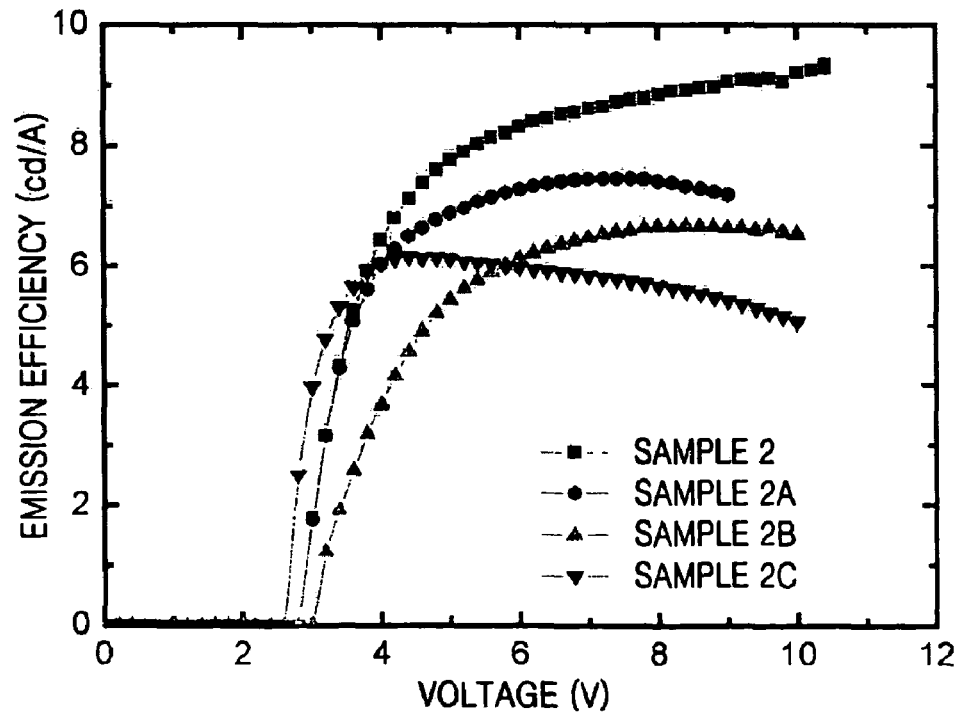

Emission efficiencies of the samples 1, 1A, 1B, and 1C, and the samples 2, 2A, 2B, and 2C were evaluated and the results are shown in FIGS. 2 and 3, respectively. The emission efficiencies were measured using a Spectroscan PR650 spectrophotometer.

As shown in FIG. 2, the sample 1 including both the $Al_2O_3$ layer as an inorganic layer and the PFB layer as a hole transport layer exhibited about 1.5-7.2 cd/A higher emission efficiency, as compared to the sample 1A including no $Al_2O_3$ layer and PFB layer, the sample 1B including no $Al_2O_3$ layer, and the sample 1C including no PFB layer. That is, the sample 1 exhibited enhancement of about 15 to 170% in emission efficiency, as compared to the samples 1A through 1C.

Similarly, as shown in FIG. 3, the sample 2 including both the $BaF_2$ layer as an inorganic layer and the PFB layer as a hole transport layer exhibited about 1.9-3.2 cd/A higher emission efficiency, as compared to the sample 2A including no $BaF_2$ layer and PFB layer, the sample 2B including no $BaF_2$ layer, and the sample 2C including no PFB layer. That is, the sample 2 exhibited enhancement of about 25 to 47% in emission efficiency, as compared to the samples 2A through 2C.

Therefore, it can be seen that an organic light emitting device including both an inorganic layer and a hole transport layer according to the present invention exhibits good emission efficiency.

Evaluation Example 2

Lifetime Characteristics

Figure 4:
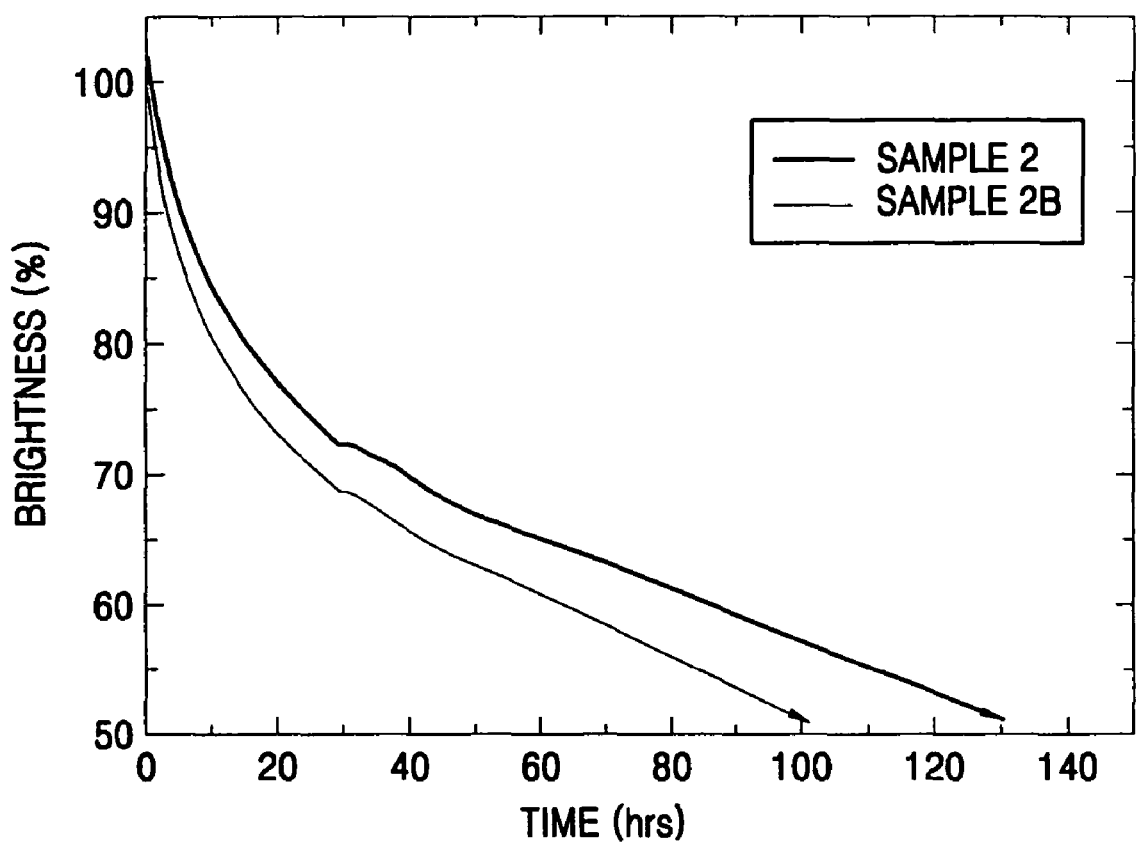
FIG. 4 is a graph illustrating the lifetime characteristics of an organic light emitting device according to an embodiment of the present invention.

Lifetime characteristics of the samples 2 and 2B were evaluated and the results are shown in FIG. 4. The lifetime characteristics were evaluated by measuring brightness with time using a photodiode.

As shown in FIG. 4, at initial brightness of 800 $cd/m^2$, the sample 2 exhibited lifetime characteristics of about 130 hours, whereas the sample 2B exhibited lifetime characteristics of about 100 hours. Therefore, it can be seen that an organic light emitting device according to the present invention has an about 30% enhanced lifetime, as compared to a common organic light emitting device.

As described above, an organic light emitting device according to the present invention has a sequentially stacked structure of a hole injection layer, an inorganic layer, a hole transport layer, and an emitting layer, and provides the following advantages.

First, combination of the inorganic layer and the hole transport layer can prevent diffusion of impurities derived from the hole injection layer into the emitting layer.

Second, combination of the inorganic layer and the hole transport layer can prevent exciton quenching in the hole injection layer.

Third, combination of the inorganic layer and the hole transport layer can facilitate electron accumulation at an interface between the hole transport layer and the emitting layer.

Fourth, combination of the inorganic layer and the hole transport layer can facilitate electron blocking and backward diffusion into the emitting layer.

Fifth, combination of the inorganic layer and the hole transport layer enables an increase of 15% or more (130% at maximum) in emission efficiency and an increase of 30% or more in lifetime characteristics.

What is claimed is:

1. An organic light emitting device, comprising:
a first electrode;
a hole injection layer formed on the first electrode;
an inorganic layer formed on the hole injection layer, the inorganic layer formed of one or more selected from the group consisting of ZnO, $SiN_x$ where $x \geq 1$, Au, Pt, Al, Ag, and Cr;
a hole transport layer formed on the inorganic layer, a material for the hole transport layer being different from a material for the hole injection layer;
an emitting layer formed on the hole transport layer; and
a second electrode formed on the emitting layer;
wherein the inorganic layer between the hole injection layer and the hole transport layer is a single layer, and the hole transport layer between the inorganic layer and the emitting layer is a single layer.

2. The organic light emitting device of claim 1, wherein an energy bandgap of a material constituting the inorganic layer is 0.1 to 15 eV higher than an energy bandgap of a material constituting the hole transport layer.

3. The organic light emitting device of claim 1, wherein the inorganic layer is made of a material having a dielectric constant of 1.0 to 80.

4. The organic light emitting device of claim 1, wherein the inorganic layer is made of a material having a work function of 3.0 to 6.0 eV.

5. The organic light emitting device of claim 1, wherein the inorganic layer has a thickness of 0.1 to 10 nm.

6. The organic light emitting device of claim 1, wherein an energy bandgap of a material constituting the hole transport layer is equal to or higher than an energy bandgap of a material constituting the emitting layer, and the difference between the energy bandgap of the material constituting the hole transport layer and the energy bandgap of the material constituting the emitting layer is not greater than 3.0 eV.

7. The organic light emitting device of claim 1, wherein the hole transport layer is made of one or more selected from the group consisting of compounds containing a carbazole group, an arylamine group, or a combination thereof, phthalocyanine-based compounds, and triphenylene derivatives.

8. The organic light emitting device of claim 1, wherein the hole transport layer is made of one or more selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N, N'-diphenyl-[1,1-biphenyl]-4,4'-diamine (TPD), N,N'-di (naphthalene-1-yl)-N,N'-diphenylbenzidine ($\alpha$-NPD), N,N'-diphenyl-N,N'-bis(1-naphthyl)-(1,1'-biphenyl)-4,4'-diamine (NPB), poly(9,9-dioctylfluorene-co-N-(4-butylphenyl) diphenylamine (TFB), and poly(9,9-dioctylfluorene-co-bis-N,N',(4-butylphenyl)-bis-N,N'-phenyl-1,4-phenylenediamine (PFB).

9. The organic light emitting device of claim 1, wherein the hole transport layer has a thickness of 1 to 100 nm.

10. The organic light emitting device of claim 1, wherein the hole injection layer is made of one or more selected from the group consisting of copper phthalocyanine (CuPc); a Starburst amine selected from TCTA and m-MTDATA; and a soluble conductive polymer selected from Pani/DBSA (polyaniline/dodecylbenzenesulfonic acid), PEDOT/PSS (poly(3,4-ethylenedioxythiophene)/poly(4-styrenesulfonate), Pani/CSA (polyaniline/camphor sulfonic acid), and PANI/PSS (polyaniline)/poly(4-styrenesulfonate).

11. The organic light emitting device of claim 1, further comprising one or more selected from the group consisting of an electron injection layer, an electron transport layer, and a hole blocking layer between the emitting layer and the second electrode.

12. An organic light emitting device, comprising:
a first electrode;
a hole injection layer formed on the first electrode;
an inorganic layer formed on the hole injection layer, the inorganic layer being a single layer, the inorganic layer comprising a material having a dielectric constant of 1 to 80 and a work function of 3.0 to 6.0 eV, the inorganic layer formed of one or more selected from the group consisting of ZnO, SiN, where x≧1, Au, Pt, Al, Ag, and Cr;
a hole transport layer formed on the inorganic layer, an energy bandgap of a material constituting the hole transport layer being 0.1 to 15 eV lower than an energy bandgap of a material constituting the inorganic layer, a material for the hole transport layer being different from a material for the hole injection layer;
an emitting layer formed on the hole transport layer;
a second electrode formed on the emitting layer; and
optionally one or more selected from the group consisting of an electron injection layer, an electron transport layer, and a hole blocking layer between the emitting layer and the second electrode;
wherein the inorganic layer between the hole injection layer and the hole transport layer is a single layer, and the hole transport layer between the inorganic layer and the emitting layer is a single layer.

13. The organic light emitting device of claim 12, wherein the inorganic layer has a thickness of 0.1 to 10 nm.

14. The organic light emitting device of claim 12, wherein an energy bandgap of a material constituting the hole transport layer is equal to higher than an energy bandgap of a material constituting the emitting layer, and the difference between the energy bandgap of the material constituting the hole transport layer and the energy bandgap of the material constituting the emitting layer is not greater than 3.0 eV.

15. An organic light emitting device, comprising:
a first electrode;
a hole injection layer on the first electrode;
an inorganic layer on the hole injection layer, the inorganic layer comprising at least one selected from the group consisting of metal halides, metal oxides, metal nitrides, metal salts, and metals, the inorganic layer comprising one or more metal atoms selected from the group consisting of Zn, Au, Pt, Ag, and Cr;
a hole transport layer on the inorganic layer, the hole transport layer comprising at least one selected from the group consisting of compounds containing a carbazole group, an arylamine group, or a combination thereof, phthalocyanine-based compounds, and triphenylene derivatives, a material for the hole transport layer being different from a material for the hole injection layer;
an emitting layer on the hole transport layer; and
a second electrode on the emitting layer;
wherein the inorganic layer between the hole injection layer and the hole transport layer is a single layer, and the hole transport layer between the inorganic layer and the emitting layer is a single layer; and
an energy bandgap of a material constituting the inorganic layer is 0.1 to 15 eV higher than an energy bandgap of a material constituting the hole transport layer, and an energy bandgap of a material constituting the hole transport layer is equal to or higher than an energy bandgap of a material constituting the emitting layer, and the difference between the energy bandgap of the material constituting the hole transport layer and the energy bandgap of the material constituting the emitting layer is not greater than 3.0 eV.

* * * * *